United States Patent
Chin et al.

(10) Patent No.: US 6,680,497 B1
(45) Date of Patent: Jan. 20, 2004

(54) INTERSTITIAL DIFFUSION BARRIER

(75) Inventors: Patrick T. Chin, Marina del Rey, CA (US); Augusto L. Gutierrez-Aitken, Redondo Beach, CA (US); Eric N. Kaneshiro, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 203 days.

(21) Appl. No.: 09/667,910

(22) Filed: Sep. 22, 2000

(51) Int. Cl.$^7$ ............................................. H01L 29/737
(52) U.S. Cl. ...................... 257/197; 257/607; 257/609; 257/615; 438/312; 438/371
(58) Field of Search ................... 257/197, 201, 257/607, 609, 610, 612, 198, 615, 917; 438/312, 371

(56) References Cited

U.S. PATENT DOCUMENTS

| | | | |
|---|---|---|---|
| 4,670,176 A | * 6/1987 | Morioka et al. | ............ 252/62.3 |
| 5,139,960 A | * 8/1992 | Chadi | ............................ 437/33 |
| 5,231,298 A | * 7/1993 | Daly | ............................ 257/191 |
| 5,828,087 A | * 10/1998 | Takahashi | ..................... 257/96 |
| 6,043,139 A | * 3/2000 | Eaglesham et al. | .......... 438/495 |
| 6,049,099 A | * 4/2000 | Vaccaro et al. | .............. 257/200 |

OTHER PUBLICATIONS

Liou, Principles and Analysis of AlGaAs/GaAs Heterojunction Bipolar Transistors, 1996, Artech House, pp. 1–3.*

* cited by examiner

*Primary Examiner*—B. William Baumeister
(74) *Attorney, Agent, or Firm*—Antonelli, Terry, Stout & Kraus, LLP

(57) ABSTRACT

A heterojunction bipolar transistor is doped in the sub-collector layer (20) with phosphorus (24). The presence of the phosphorus causes any interstitial gallium (22) to be bonded (26) to the phosphorus (24) and move to a lattice site. The result is that the interstitial gallium does not diffuse to the base layer and thus does not cause the beryllium to be displaced and diffused. Instead of doping with phosphorus, a layer including phosphorus can also be utilized.

3 Claims, 2 Drawing Sheets

INTERSTITIAL DIFFUSION BARRIER

BACKGROUND OF THE INVENTION

1. Field of the Invention

This invention relates generally to a heterojunction bipolar transistor with phosphorus doping and more particularly to a heterojunction bipolar transistor with phosphorus doping to prevent diffusion of beryllium atoms from the collector to the emitter.

2. Discussion of the Prior Art

Some of the reliability problems of HBT's have been traced to the gallium interstitial atoms formed in the sub-collector region and beryllium atoms which migrate to the emitter during the formation of the device.

In one form of this transistor, the layers are grown in series on top of each other as shown in FIG. 3. The first layer 30 is an $N^+$ InGaAs sub-collector layer which contains a large concentration of silicon atoms. A collector region 32 is formed on top of the sub-collector as an $N^-$ GaAs layer with a lower concentration of silicon. A $P^+$ base layer 34 is formed thereon of GaAs with beryllium doping. An emitter layer 36 is then formed on top of the base layer.

The crystal structure 10 of a sub-collector of a prior art device is shown in FIG. 1. As shown in FIG. 1, gallium atoms may reside in the crystal structure at interstitial locations. Since these atoms are not tightly bonded to the crystal structure, they often diffuse through the structure, especially during the growth of the other layers. Since the growth is relatively slow, on the order of one layer of atoms per second, the interstitial gallium can diffuse as the device is grown. Problems arise when the interstitial gallium reaches the base layer. In that layer, the interstitial gallium atoms from the sub-collector tends to displace the beryllium atoms from their positions in the base so that they are free to diffuse to the emitter. The result is poor reliability of the device.

Previously this problem has been approached by varying the growth conditions such as temperature and overpressure of the group-V material. However, these types of procedures have not been completely successful.

SUMMARY OF THE INVENTION

Accordingly, one object of the invention is to provide a novel HBT device having phosphorus doping in the sub-collector.

A further object of this invention is to improve the reliability of HBT devices by preventing the diffusion of beryllium atoms from the base to the emitter.

Briefly, these and other objects of this invention are achieved by providing phosphorus in the form of doping of the sub-collector layer or by providing a collector layer having phosphorus such as InP.

BRIEF DESCRIPTION OF THE DRAWINGS

A more complete appreciation of the invention and many of the attendant advantages thereof will be readily obtained as the same becomes better understood by reference to the following detailed description considered in connection with the accompanying drawings, wherein.

DESCRIPTION OF THE PREFERRED EMBODIMENTS

Figure 1:
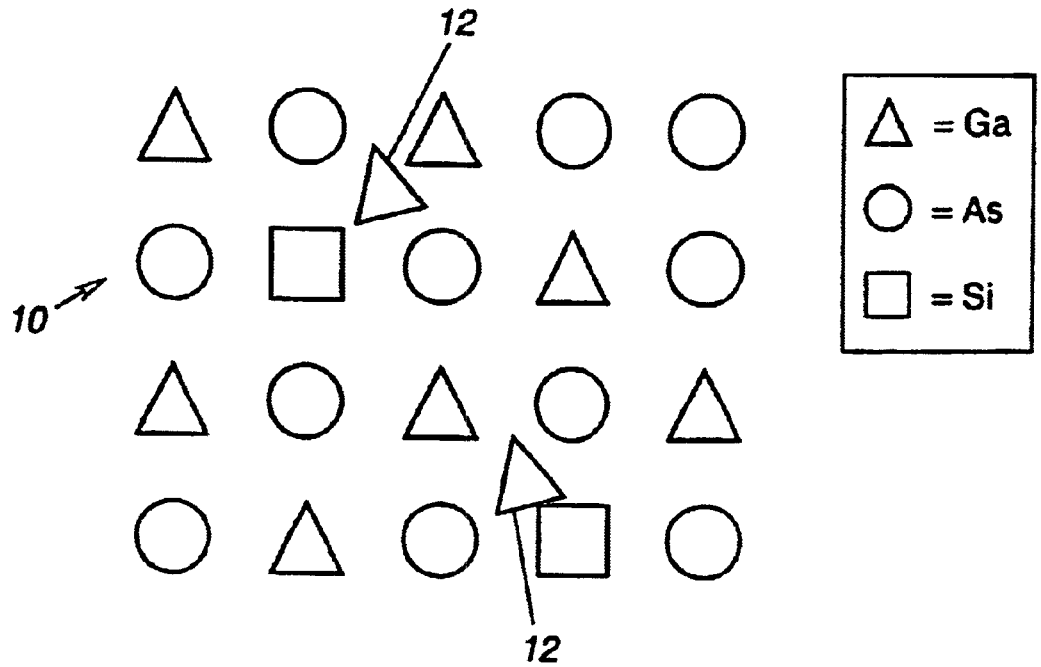
FIG. 1 is a diagram of the crystal structure of a prior art device.
Figure 2:
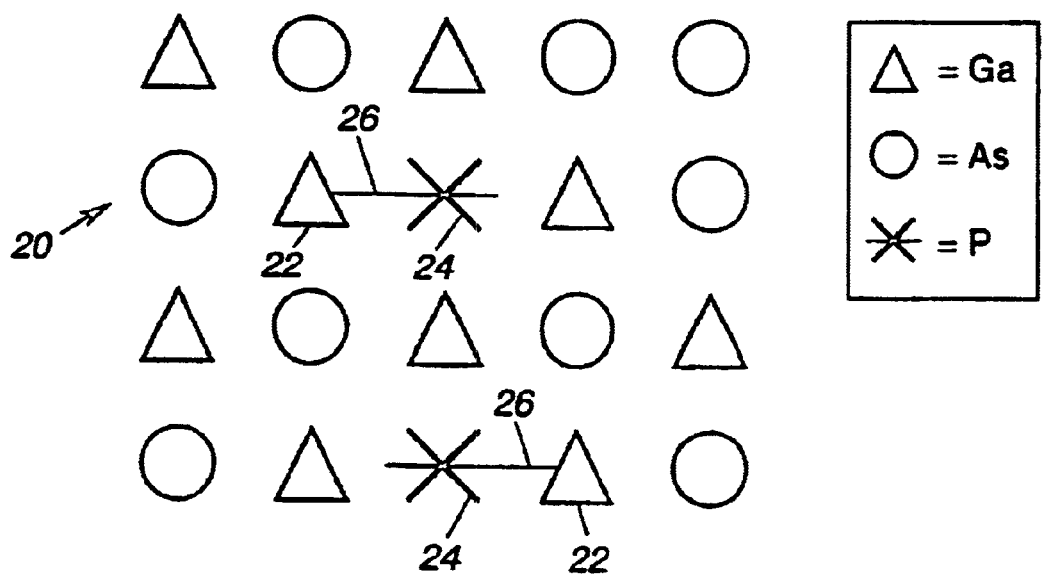
FIG. 2 is diagram of the crystal structure of the present invention.
Figure 3:
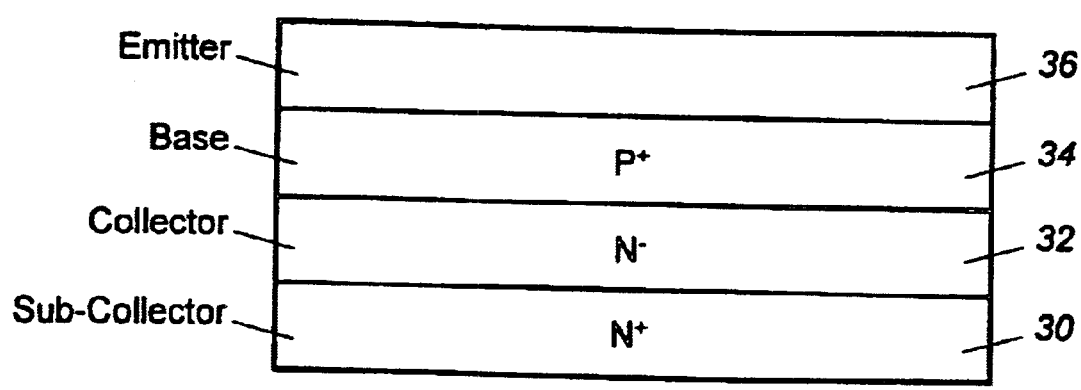
FIG. 3 is a diagram of the layers of the transistor of the present invention.

Referring now to the drawings, wherein like reference numerals designate identical or corresponding parts throughout the several views, and more particularly to FIG. 2 thereof, wherein the crystal structure 20 of a sub-collector of the present invention is shown. The structure is similar to that of the prior art, except that phosphorus doping has been introduced. With this arrangement, the interstitial gallium 22 and the phosphorus dopant 24 take up positions in the crystal structure with a strong bond 26 therebetween. This bonded pair then replaces the silicon and arsenic atoms which were in close proximity to the interstitial gallium.

The bond between the gallium and phosphorus atoms is the strongest bond among the bonds in InAs, GaAs, InP or GaP. Therefore, it is the most stable bond. By bonding the interstitial gallium, it moved to a lattice site and thus is no longer free to diffuse. Since it does not diffuse, the chance of beryllium diffusing out of the base layer decreases, thus preventing the reliability problems previously noted.

The interstitial gallium concentration can be reduced by doping with phosphorus at a level of $1 \times 10^{18}$ to $1 \times 10^{19}$ atoms per cubic centimeter. At this concentration of phosphorus, movement of interstitial gallium and beryllium diffusion is prevented. The doping can also be in the collector layer.

The above description has been achieved in an InGaAs-collector device. However, a same effect can be expected in an GaAs device in a similar fashion. That is, the phosphorus doping in the GaAs sub-collector or collector regions of this device may also prevent base beryllium diffusion.

Another way of preventing the diffusion of interstitial gallium in these devices is to provide a collector of InP. Having the phosphorus in such a layer then removes the interstitial gallium as it diffuses from the sub-collector. Thus, it is prevented from reaching the base so that the same end result is achieved. Of course, such an arrangement changes the device characteristics. For example, the InP has a higher breakdown voltage than a layer of InGaAs. Of course, the sub-collector region could also be replaced with a layer of InP so that gallium is not present at all thus preventing the problem in this manner as well.

These arrangements would not be limited to an InP based HBT structure. Any excess group-III interstitial (for example, gallium) can be reduced by the presence of a different group-V (for example, phosphorus) if the bonding (Ga—P) energy is higher than that of the original matrix (Ga—As). Thus, this method has broader application than that described.

Numerous additional modifications and variations of the present invention are possible in light of the above teachings. It is, therefore, to be understood that within the scope of the appended claims, the invention may be practiced otherwise than as specifically described herein.

What is claimed is:

1. A heterojunction bipolar transistor comprising:

an $N^+$ sub-collector layer comprising a compound consisting of GaInAs, with a high concentration of Si, said $N^+$ sub-collector layer being substantially free of Al;

an $N^-$ collector layer provided on said sub-collector and comprising a compound consisting of GaInAs, with a low concentration of Si, said $N^-$ collector layer being substantially free of Al;

a $P^+$ base layer provided on said collector and containing In, Ga, and As, and a large concentration of Be; and an emitter layer provided on said base;

wherein phosphorus dopant is included in said sub-collector layer and said collector layer so as to bond with any interstitial gallium and move it to a lattice site.

2. A method of forming an InP based heterojunction bipolar transistor, comprising the steps of:

forming an $N^+$ sub-collector layer comprising a compound consisting of GaInAs, with a high concentration of Si, said $N^+$ sub-collector layer being substantially free of Al;

forming on said sub-collector layer an $N^-$ collector layer comprising a compound consisting of GaInAs, with a low concentration of Si, said $N^-$ collector layer being substantially free of Al;

forming on said collector layer a $P^+$ base layer containing In, Ga, and As, and a large concentration of Be; and forming an emitter layer on said base layer; and including phosphorous in said sub-collector layer and said collector layer to cause interstitial gallium atoms to move to a lattice site.

3. A method of preventing the diffusion of Be atoms from the base to the emitter of a heterojunction bipolar transistor, comprising the steps of:

forming an $N^+$ sub-collector layer comprising a compound consisting of GaInAs, with a high concentration of Si, said $N^+$ sub-collector layer being substantially free of Al;

forming on said sub-collector layer an $N^-$ collector layer comprising a compound of GaInAs, with a low concentration of Si, said $N^-$ collector layer being substantially free of Al;

forming on said collector layer a $P^+$ base layer containing In, Ga, and As, and a large concentration of Be;

forming an emitter layer on said base layer; and including phosphorous in said sub-collector layer and said collector layer to cause interstitial gallium atoms to move to a lattice site.

* * * * *